(12) United States Patent
Kusano

(10) Patent No.: US 8,334,591 B2
(45) Date of Patent: Dec. 18, 2012

(54) SEMICONDUCTOR DEVICE AND METHOD OF MANUFACTURING THE SAME

(75) Inventor: Hidetoshi Kusano, Kanagawa (JP)

(73) Assignee: Sony Corporation, Tokyo (JP)

( * ) Notice: Subject to any disclaimer, the term of this patent is extended or adjusted under 35 U.S.C. 154(b) by 242 days.

(21) Appl. No.: 12/588,524

(22) Filed: Oct. 19, 2009

(65) Prior Publication Data

US 2010/0096747 A1  Apr. 22, 2010

(30) Foreign Application Priority Data

Oct. 22, 2008  (JP) ................................. 2008-272247

(51) Int. Cl.
*H01L 23/10* (2006.01)
*H01L 23/34* (2006.01)

(52) U.S. Cl. .................................. 257/706; 257/E23.08

(58) Field of Classification Search .................. 257/706, 257/E23.08; 438/122
See application file for complete search history.

(56) References Cited

U.S. PATENT DOCUMENTS

| | | | | |
|---|---|---|---|---|
| 5,968,209 A * | 10/1999 | Kono | ............................ | 29/25.03 |
| 6,233,960 B1 * | 5/2001 | Kang et al. | .................... | 62/259.2 |
| 6,294,831 B1 * | 9/2001 | Shishido et al. | .............. | 257/729 |
| 6,486,562 B1 * | 11/2002 | Kato | ............................ | 257/778 |
| 6,574,106 B2 | 6/2003 | Mori | | |
| 7,074,645 B2 * | 7/2006 | Huang et al. | .................. | 438/106 |
| 7,679,184 B2 * | 3/2010 | Kusano et al. | ................. | 257/714 |
| 2003/0085475 A1 * | 5/2003 | Im et al. | ........................ | 257/796 |
| 2004/0174682 A1 * | 9/2004 | Lin et al. | ........................ | 361/705 |
| 2006/0047043 A1 * | 3/2006 | Nakayoshi et al. | ........... | 524/413 |

FOREIGN PATENT DOCUMENTS

| | | |
|---|---|---|
| JP | 09-213837 A | 8/1997 |
| JP | 10-242355 A | 9/1998 |
| JP | 11-354677 | 12/1999 |
| JP | 2000-012744 A | 1/2000 |
| JP | 2000-106410 A | 4/2000 |
| JP | 2000-349203 A | 12/2000 |
| JP | 2002-151613 A | 5/2002 |

OTHER PUBLICATIONS

Japanese Office Action issued Aug. 10, 2010 for corresponding Japanese Application No. 2008-272247.

* cited by examiner

*Primary Examiner* — Lex Malsawma
(74) *Attorney, Agent, or Firm* — Rader Fishman & Grauer, PLLC

(57) ABSTRACT

A semiconductor device includes: a substrate; a semiconductor chip with a surface facing down mounted on the substrate; a reinforcement material provided on the substrate in a peripheral region of a region on which the semiconductor chip is mounted; and a heat sink coupled to the semiconductor chip via a highly thermally conductive material. The heat sink is disposed on the semiconductor chip and the reinforcement material by being coupled to the reinforcement material via an adhesive material, and is provided with an uneven area on a side coupled to the reinforcement material.

23 Claims, 15 Drawing Sheets

US 8,334,591 B2

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same. Specifically, the invention relates to a semiconductor device including a heat sink coupled to a semiconductor chip via a highly thermally conductive material and a method of manufacturing the same.

2. Description of the Related Art

In recent years, electronic devices, such as computers, cellular phones, and PDAs (Personal Digital Assistance) have been small-sized, sophisticated, and made to operate at a high speed. Accordingly, small, fast, high-density semiconductor devices with semiconductor chips, such as ICs (integrated circuits) and LSIs (large-scale integrated circuits), for such electronic devices are further desired. Consequently, such small, fast, high-density semiconductor devices may consume more power, causing the heat value per unit volume to increase.

As a structure for mounting a semiconductor chip, there is a structure for flip-chip bonding a semiconductor chip to a substrate using solder bumps with the side on which electrodes are formed facing down. However, such a flip-chip bonded semiconductor device may also cause a problem in that stress is generated in the area coupled with the solder bumps due to the heat depending on the difference in coefficients of thermal expansion between the semiconductor chip and the substrate, reducing the connection reliability.

A technique according to Japanese Unexamined Patent Application Publication No. 11-354677 is, therefore, proposed in order to address problems, such as stress generated in the connected area when a semiconductor chip and a substrate having different thermal expansion coefficients are connected with connecting members such as solder bumps.

Specifically, in Japanese Unexamined Patent Application Publication No. 11-354677, a technique is proposed, in which a member (lid) having a value of a thermal expansion coefficient identical or approximately identical to that of the substrate is used for packaging. Consequently, such a technique suppresses stress generated in a coupling member that individually couples a plurality of pads provided on the substrate to a plurality of input terminals provided on the semiconductor chip.

The technique according to Japanese Unexamined Patent Application Publication No. 11-354677 is described below with reference to the drawings.

FIG. 15 is a diagrammatic view for illustrating a semiconductor device in related art, and a semiconductor device 101 shown in the drawing includes a wiring substrate 102, a semiconductor chip 103, and a lid 104 provided on the upper side of the semiconductor chip 103.

The wiring substrate 102 has a plurality of pads 105, and the pads 105 are connected to wiring disposed on the surface or inside the layer of the wiring substrate 102.

The semiconductor chip 103 is flip-chip bonded to the wiring substrate 102 with the surface facing down. In addition, a plurality of input and output terminals 106 are provided on the lower side (surface) of the semiconductor chip 103, and the input and output terminals 106 are aligned in a matrix and disposed at positions corresponding to the plurality of pads 105 on the wiring substrate 102. Each of the plurality of input and output terminals 106 is connected to the corresponding one of the plurality of the pads 105 by solders 107.

The lid 104 is provided with a recess and has the cross-section in the recessed form. The bottom side of the recess is bonded to the upper side of the semiconductor chip 103 with a highly thermally conductive adhesive material 108. The end edge of the lid 104 is bonded to the upper side of the wiring substrate 102 with an adhesive material 109. The semiconductor chip 103 is thus in the state of fully sealed by the lid 104, the adhesive material 109, and the wiring substrate 102.

The lid 104 is made of copper or brass. The thermal expansion coefficient of copper is $16.5 \times 10^{-6}/°$ C. and the thermal expansion coefficient of brass is $17.3 \times 10^{-6}/°$ C., which are the values approximately identical to the thermal expansion coefficient of the wiring substrate 102 (15 to $20 \times 10^{-6}/°$ C.).

In this way, the technique according to Japanese Unexamined Patent Application Publication No. 11-354677 suppresses stress applied to the solders 107 by making the lid 104 with a material having a thermal expansion coefficient identical or approximately identical to that of the wiring substrate 102.

When a semiconductor chip is flip-chip bonded to a wiring substrate, an underfill material is typically used for reinforcement in order to protect electrically connected areas between the wiring substrate and the semiconductor chip. Specifically, after a gap between the wiring substrate and the semiconductor chip is filled with a liquid underfill material containing an epoxy resin and the like as a major component, heat is applied to the underfill material for curing, and thereby the electrically connected areas between the wiring substrate and the semiconductor chip can be reinforced.

However, warpage occurs in the wiring substrate due to the influence of the heat for curing the underfill material, so that the gaps between the wiring substrate and the lid vary from package to package and there is a variation even within a package. Accordingly, in order to securely fix the lid to the wiring substrate, the amount of the adhesive material to be applied between the wiring substrate and the lid may be increased, and as a result, there has been a problem of leakage of the adhesive material.

In other words, in a case in which the gaps between the wiring substrate and the lid vary, when the adhesive material is applied with an assumption that the gap between the wiring substrate and the lid is small, the amount of the adhesive material may be insufficient and there is a possibility that the lid is fixed insufficiently. Accordingly, a large amount of the adhesive material has to be applied with an assumption that the gap between the wiring substrate and the lid is large, which leads to leakage of the adhesive material, resulting in problems, such as causing defects in packages and braking air vents.

Therefore, in order to prevent the adhesive material from leaking out of the package outline while securing a sufficient connection between the lid and the wiring substrate, a recess for bonding 120 slightly smaller than the size of the lid is formed in a lid as shown in FIG. 16.

In other words, the problems such as causing defects in packages and braking air vents are addressed by holding the leaked adhesive material in the recess for bonding 120, even when the adhesive material leaks out with a large amount of the adhesive material being applied with an assumption that the gap between the wiring substrate and the lid is large. The symbol A in FIG. 16 indicates the leaked adhesive material.

SUMMARY OF THE INVENTION

As semiconductor packages for the next generation, however, it is assumed that coreless substrates are used. Since the warping deformation in a case of using a coreless substrate may be larger than a case of a substrate in related art (a substrate having a core material C), the leakage of the adhesive material may be difficult to be handled sufficiently even when using a lid provided with a recess for bonding.

Moreover, the increase in warping deformation may cause the areas of bonding a coreless substrate and a lid to be smaller and the lid is not fixed sufficiently to the coreless substrate.

An embodiment of the present invention was made in consideration of these issues, and it is desirable to provide a semiconductor device capable of sufficiently securing the areas of bonding a substrate and a heat sink and also clearing defects caused by the leakage of an excess of the adhesive material and a method of manufacturing the same.

According to an embodiment of the present invention, a semiconductor device includes: a substrate; a semiconductor chip with a surface facing down mounted on the substrate; a reinforcement material provided on the substrate in a peripheral region of a region on which the semiconductor chip is mounted; and a heat sink coupled to the semiconductor chip via a highly thermally conductive material, the heat sink being disposed on the semiconductor chip and the reinforcement material by being coupled to the reinforcement material via an adhesive material, the heat sink being provided with an uneven area on a side coupled to the reinforcement material.

In the present embodiment, it is possible to hold an excess of the adhesive material by the uneven area, which is provided on the side coupled to the reinforcement material, of the heat sink, and the defects caused by the leakage of the excess of the adhesive material can be eliminated. Moreover, the uneven area provided on the side coupled to the reinforcement material of the heat sink increases the contact area of the heat sink and the adhesive material, thereby sufficiently securing the areas of bonding the substrate and the heat sink.

According to another embodiment of the present invention, a method of manufacturing a semiconductor device includes the steps of: flip-chip bonding a semiconductor chip with a surface facing down to a substrate provided with a wiring pattern; forming a reinforcement material in a peripheral region of the flip-chip bonded semiconductor chip; and coupling a heat sink, provided with an uneven area on a side coupled to the reinforcement material, to the semiconductor chip and the reinforcement material after applying a highly thermally conductive material on a back side of the semiconductor chip and applying an adhesive material on a surface of the reinforcement material.

It is possible to hold an excess of the adhesive material in the uneven area by coupling the heat sink provided with the uneven area on the side coupled to the reinforcement material, and the defects caused by the leakage of the excess of the adhesive material can be eliminated. Moreover, the contact area of the heat sink and the adhesive material is increased, thereby sufficiently securing the areas of bonding the substrate and the heat sink.

In the semiconductor device according to an embodiment of the present invention and a method of manufacturing the same, it is possible to sufficiently secure the areas of bonding the substrate and the heat sink, and further to clear the defects caused by the leakage of the excess of the adhesive material.

DESCRIPTION OF THE PREFERRED EMBODIMENTS

Embodiments of the present invention are described below with reference to the drawings for better understanding of the present invention.

Figure 1A:
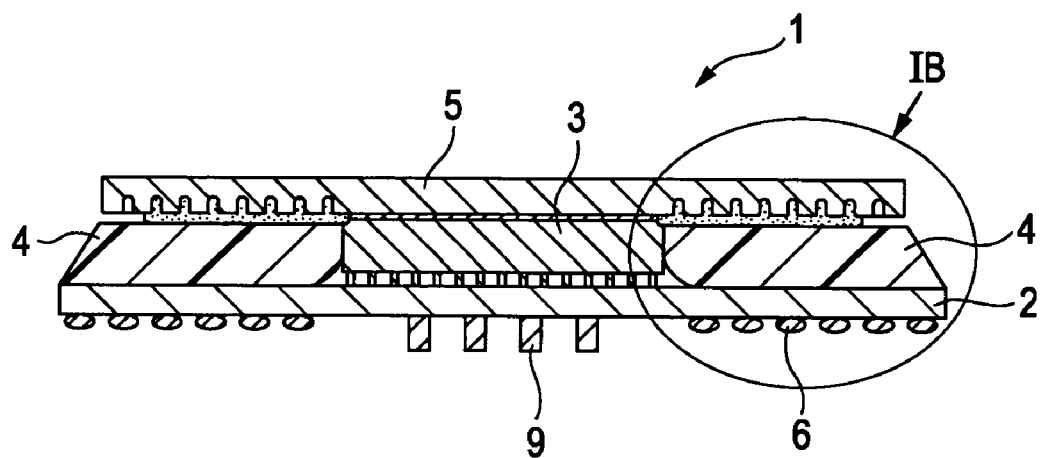
FIGS. 1A and 1B are diagrammatic views for illustrating an example of a semiconductor device according to an embodiment of the present invention.
Figure 1B:
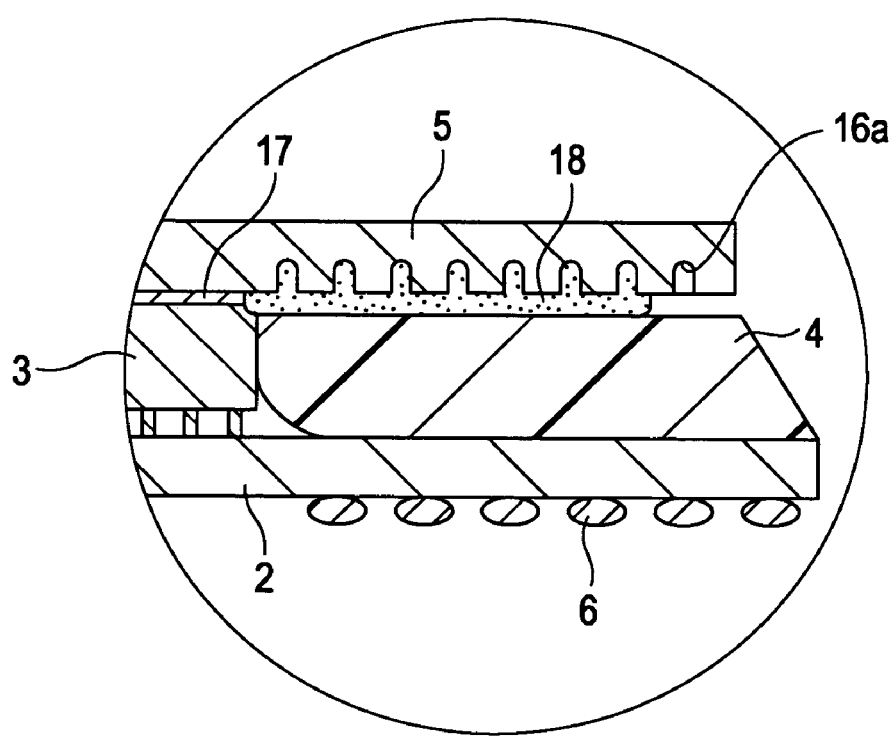

FIGS. 1A and 1B are diagrammatic views for illustrating an example of a semiconductor device according to an embodiment of the present invention. A semiconductor device 1 shown in the drawing includes a coreless substrate 2, a semiconductor chip 3, such as an LSI flip-chip bonded to the coreless substrate 2 with the surface facing down, a sealing resin layer 4 sealing the periphery of the semiconductor chip 3, and a lid 5 disposed on the semiconductor chip 3.

In an example shown in the present embodiment, the semiconductor device 1 has a semiconductor package structure of BGA (Ball Grid Array) where a plurality of solder balls 6 are placed in an array on the back side of the coreless substrate 2. "The back side of the coreless substrate 2" indicates the side opposite to the side on which to mount the semiconductor chip 3.

"A surface of the semiconductor chip 3" indicates the side provided with a conductive portion electrically coupled to the coreless substrate 2 to be mounted. The semiconductor chip 3 is mounted to the coreless substrate 2 with the surface facing down, thereby causing a conductive path between the semiconductor chip 3 and the coreless substrate 2 to be shortened and a semiconductor device to be small-sized.

Further, the semiconductor chip 3 is flip-chip bonded by electrically connecting the coreless substrate 2 and the semiconductor chip 3 with the C4 (Controlled Collapse Chip Connection) technique using solder bumps.

Moreover, the gap between the semiconductor chip 3 and the coreless substrate 2 is filled with an underfill material (not shown). When the gap is filled with the underfill material, it becomes possible to distribute the stress generated in the area coupled with the solders due to the difference in thermal expansion coefficients of the coreless substrate 2 and the semiconductor chip 3 during temperature cycling, and thus the operational stability relative to temperature variation is improved.

In this way, such an underfill material is used for the protection of the area coupled with the solders, and preferably has an appropriate filling viscosity. It is, however, naturally considered that such an underfill material may come out of the gap between the coreless substrate 2 and the semiconductor chip 3 to the side face of the semiconductor chip 3 depending on the viscosity, the surface tension, and the manufacturing method. Therefore, the sealing resin layer 4 described later preferably seals the underfill material coming out to the side face of the semiconductor chip 3. The employment of such a configuration protects the semiconductor chip 3 from the environment, such as light, heat, and humidity.

The coreless substrate 2 is provided with ball land areas (not shown) on the back side, and the individual ball land areas are coupled to the solder balls 6. The coreless substrate 2 is further provided with electrode pads (not shown) on the back side, and capacitors 9 are mounted on the individual electrode pads.

Figure 2:
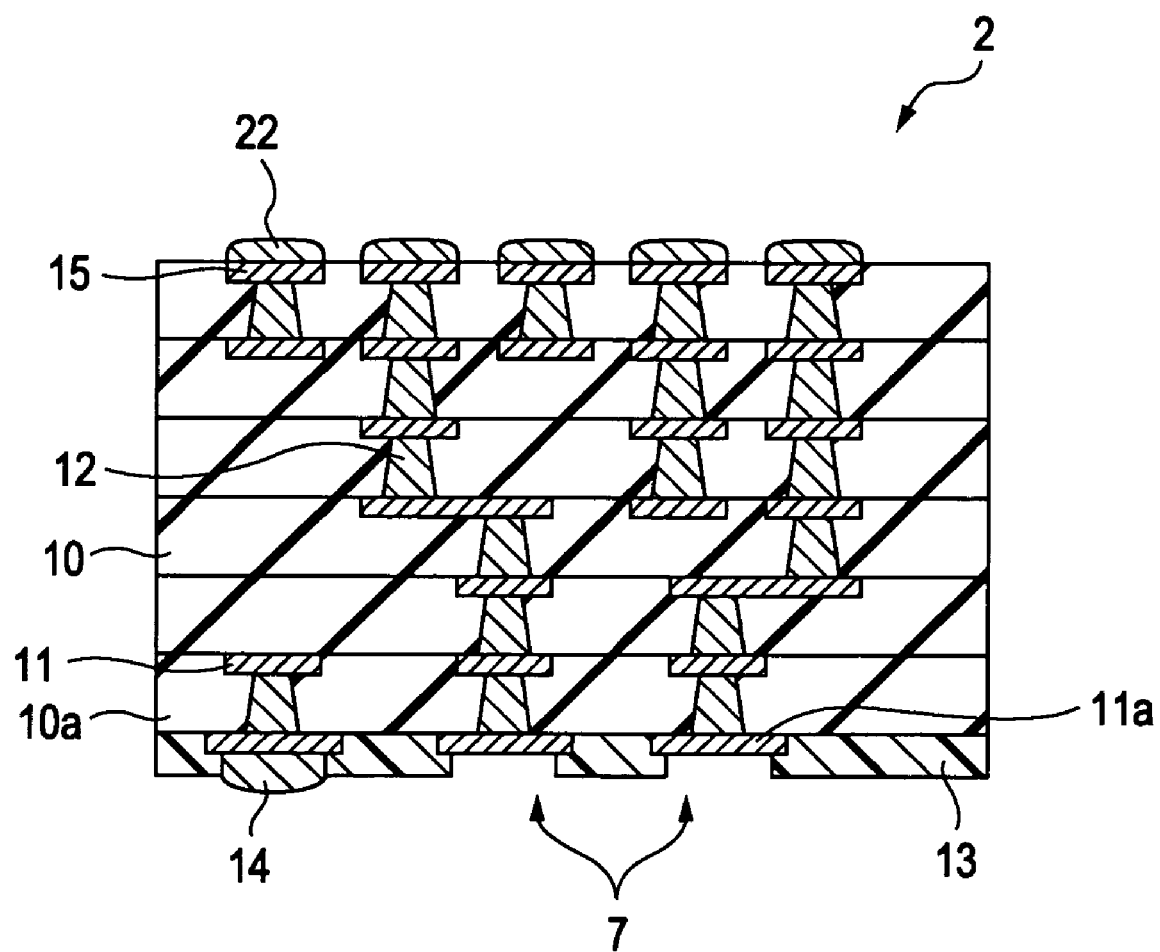
FIG. 2 is a diagrammatic cross-sectional view for illustrating a structure of a coreless substrate in detail.

FIG. 2 is a diagrammatic cross-sectional view for illustrating a structure of the coreless substrate 2 according to the present embodiment in detail. The coreless substrate 2 shown in the drawing has a multilayer wiring structure in which an interlayer insulating film 10 and a wiring layer 11 are stacked alternately, resulting in a plurality of wiring layers 11 stacked via a plurality of interlayer insulating films 10. The wiring layers 11 are made with, for example, a copper material, and the wiring layers 11 in different layers are electrically connected by via plugs 12 provided in the interlayer insulating films 10. Further, a solder resist layer 13 made of a resin material excellent in heat resistance is formed in the periphery of a wiring layer 11a on the back side of the coreless substrate 2, so that an interlayer insulating film 10a in the lowermost layer is coated with the solder resist layer 13 that prevents the solders from adhering to portions other than the intended spots when soldering the coreless substrate 2.

On the back side of the coreless substrate 2, a plurality of ball land areas 7 to which the solder balls 6 are coupled are placed in an array. On the electrode areas to mount the capacitors 9, electrode pads 14 made of tin (Sn), silver (Ag), copper (Cu), or an alloy thereof are formed.

On the other hand, on the surface of the coreless substrate 2 to mount the semiconductor chip 3, a plurality of electrode pads 15 of nickel (Ni), lead (Pb), gold (Au), or an alloy thereof formed by electrolytic plating are placed in an array. In addition, on the electrode pads 15, C4 bumps 22 made of tin, lead, or an alloy thereof are provided.

In this way, in the present embodiment, the use of a coreless substrate enables a six-layer structure, for example, to be thinned to approximately 300 μm. Since the wiring resistance is reduced by thinning a substrate, such a semiconductor device is expected to increase the operational speed.

The capacitors 9 are connected to the back side of the coreless substrate 2 in the area directly beneath the semiconductor chip 3. This shortens the wiring paths from the semiconductor chip 3 to the capacitors 9, reducing the wiring resistance. The spots to place the capacitors 9 are not particularly limited to the back side of the coreless substrate 2 in the area directly underneath the semiconductor chip 3. For example, the capacitors 9 may also be placed on the back side of the coreless substrate 2 in other areas than the area directly underneath the semiconductor chip 3 as long as the wiring paths can be sufficiently short. Alternatively, the capacitors 9 may also be placed on the surface of the coreless substrate 2 within the range allowing the wiring paths to be sufficiently short.

The sealing resin layer 4 is formed to have a thickness approximately identical to that of the semiconductor chip 3. Further, the sealing resin layer 4 desirably covers the coreless substrate 2 to outside the solder ball 6 in the outermost position among the plurality of solder balls 6 placed in an array. This is because, since the strength of the coreless substrate 2 is improved by the sealing resin layer 4, the warpage in the coreless substrate 2 can be suppressed, and as a result, the electrical connection of the solder balls 6 is expected to be improved.

The lid 5 is made of a highly thermally conductive material (a copper material, for example), and is coupled to the semiconductor chip 3 via a TIM (Thermal Interface Material) material 17, which is a highly thermally conductive material applied on the back side of the semiconductor chip 3. Moreover, the lid 5 is coupled to the sealing resin layer 4 with an adhesive material (sealing band material) 18 applied on the surface of the sealing resin layer 4.

Here, the TIM material 17 of the present embodiment is produced by mixing a thermally conductive filler in a resin material, and the resin material may include, for example, addition curable silicone compositions. Such an addition curable silicone composition is made of a curing silicone composition containing a liquid silicone as a base polymer, and is produced by adding, for example, a thermosetting adhesion providing component in the curing silicone composition. Specifically, there are addition curable silicone rubber compositions containing organohydrogensiloxane having an alkoxysilyl group (refer to Japanese Examined Patent Application Publication 53-21026, for example), addition curable silicone rubber compositions containing organohydrogensiloxane having an epoxy group (refer to Japanese Examined Patent Application Publication 53-13508, for example), and the like.

The thermally conductive filler functions as a medium for heat transfer between the semiconductor chip 3 and the lid 5. Specifically, examples include thermally conductive filler made of a filler material, such as silver (Ag), aluminum (Al), aluminum oxide ($Al_2O_3$), and silicon dioxide ($SiO_2$), in the form of particles, powder materials, or the like. The thermally conductive filler may be made of any one of these filler materials, and may also be made of a plurality of filler materials having different particle diameters.

The thermally conductive filler also has a function as a spacer that keeps the gap between the semiconductor chip 3 and the lid 5 other than the function as a medium for thermal conductance. The function as a spacer determines the thickness of the TIM material in which the thermally conductive filler is mixed, that is, the thickness of the TIM material interposed between the semiconductor chip 3 and the lid 5.

In addition, a plurality of dimples (recesses) 16a are formed on the lid 5 on the side coupled to the sealing resin layer 4. In other words, an uneven area is provided on the lid 5 on the side coupled to the sealing resin layer 4.

A method of manufacturing a semiconductor device having a configuration as above is described below. In other words, a description is given for an example of a method of manufacturing a semiconductor device according to an embodiment of the present invention.

Figure 3:
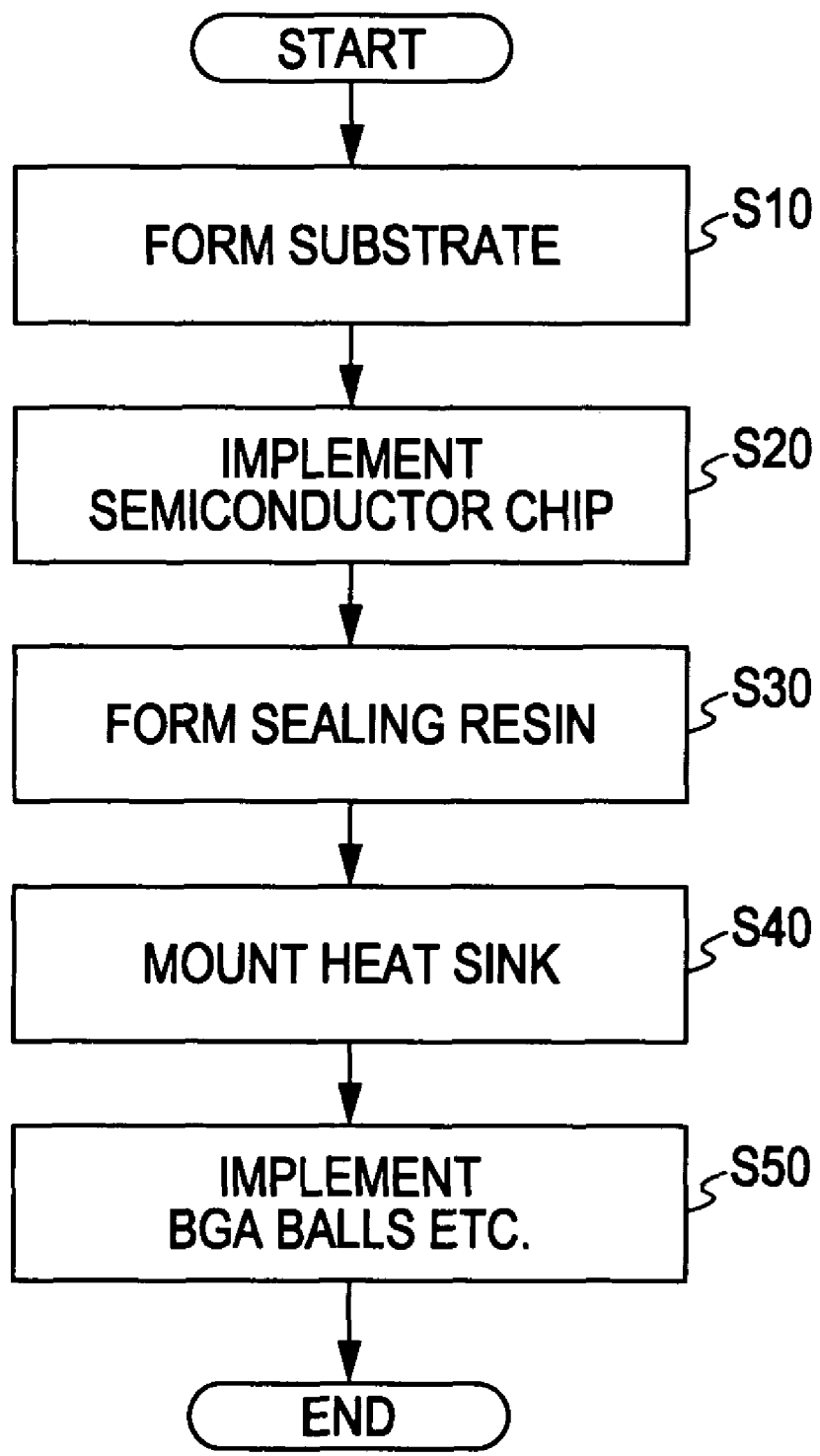
FIG. 3 is a flow chart schematically showing an example of a method of manufacturing a semiconductor device according to the embodiment.

FIG. 3 is a flow chart schematically showing an example of a method of manufacturing a semiconductor device according to the embodiment. Firstly, a coreless substrate having a multilayer wiring structure is formed (S10), and a semiconductor chip is mounted on the coreless substrate (S20). Next, the semiconductor chip is sealed with a sealing resin (S30), and a lid is mounted thereon (S40). After that, solder balls, capacitors, and the like are mounted on the back side of the coreless substrate (S50).

The method of forming a coreless substrate, the method of mounting a semiconductor chip, and the method of forming a sealing resin are described below in detail.

[Method of Forming Coreless Substrate]

Figure 4A:
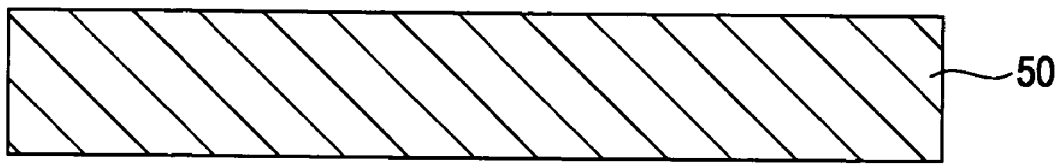
FIGS. 4A to 4C are diagrammatic views (1) for illustrating the example of the method of manufacturing the semiconductor device according to the embodiment.
Figure 4B:
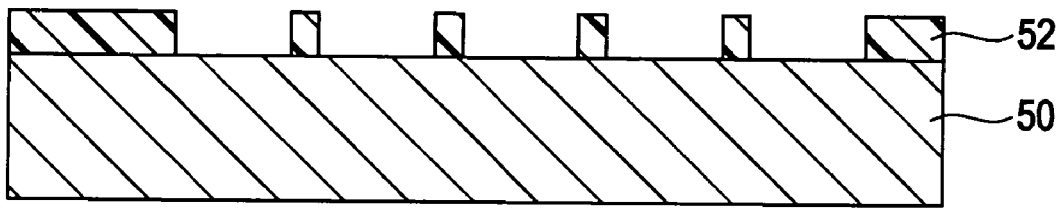
Figure 4C:
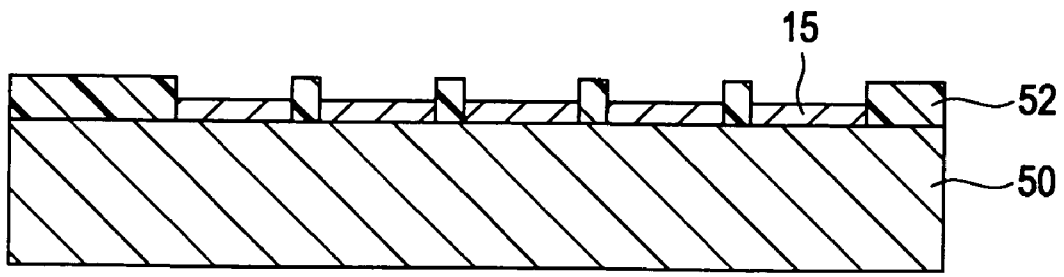

Firstly, as shown in FIGS. 4A and 4B, a resist film 52 is applied on a copper substrate 50, and the resist film 52 is patterned in the form having predetermined openings by illumination of laser light. Next, as shown in FIG. 4C, the electrode pads 15 made of, for example, nickel (Ni), lead (Pb), gold (Au), or an alloy thereof are formed on the copper substrate 50 by electrolytic plating using the resist film 52 as a mask.

Figure 5A:
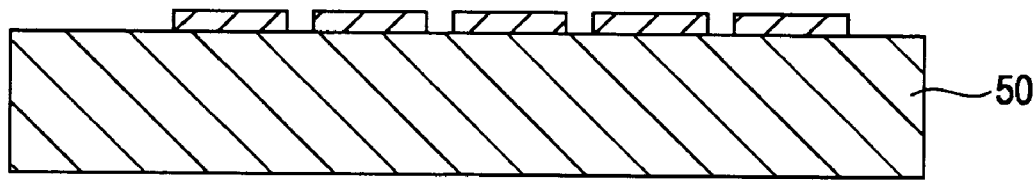
FIGS. 5A to 5C are diagrammatic views (2) for illustrating the example of the method of manufacturing the semiconductor device according to the embodiment.
Figure 5B:
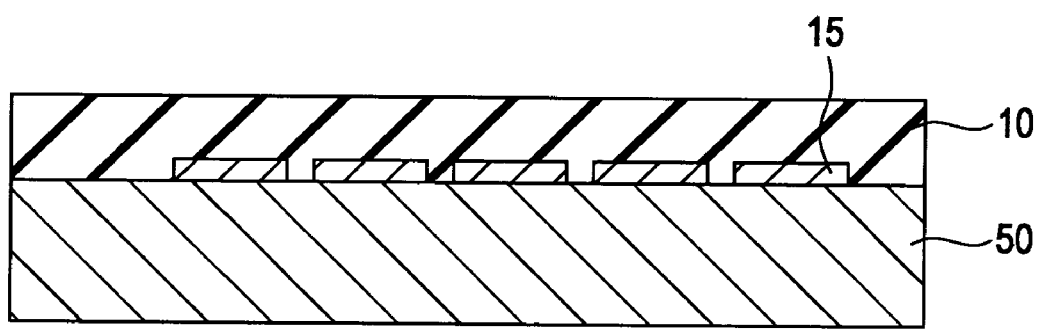
Figure 5C:
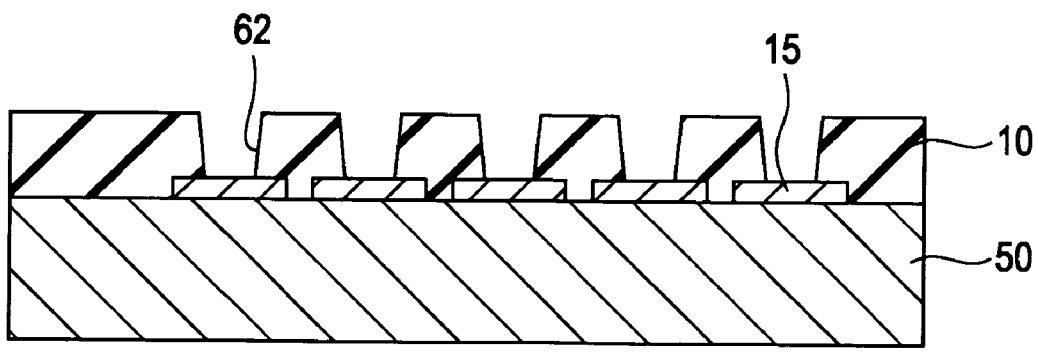

Then, after removing the resist film 52 as shown in FIG. 5A, the interlayer insulating film 10 is formed on the copper substrate 50 as shown in FIG. 5B. Then, as shown in FIG. 5C, predetermined regions of the interlayer insulating film 10 are removed by laser light to form via holes 62. Forming each of the via holes 62 by laser machining reduces manufacturing costs compared to the cases of drilling.

Figure 6A:
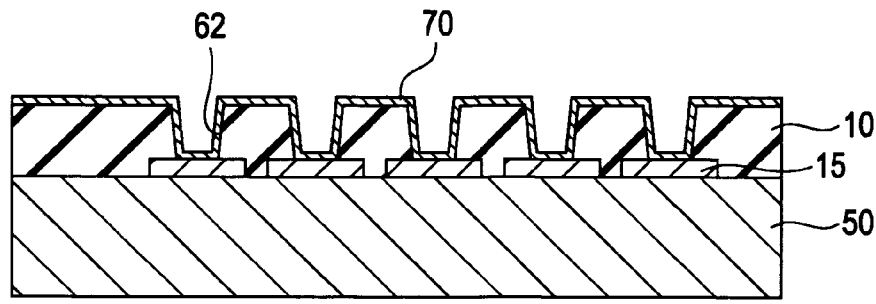
FIGS. 6A to 6D are diagrammatic views (3) for illustrating the example of the method of manufacturing the semiconductor device according to the embodiment.
Figure 6B:
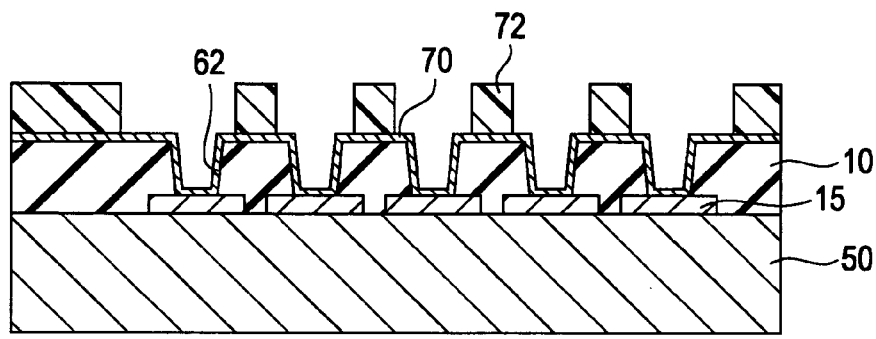

Then, as shown in FIG. 6A, a seed layer 70 made of copper is formed on the surface of the interlayer insulating film 10, the side faces and the bottoms of the via holes 62 by non-electrolytic plating. The seed layer 70 becomes cores to grow copper during electrolytic plating of copper described later. Subsequently, as shown in FIG. 6B, a resist film 72 is applied on the seed layer 70 and is patterned in the form having predetermined openings by illumination of laser light.

Figure 6C:
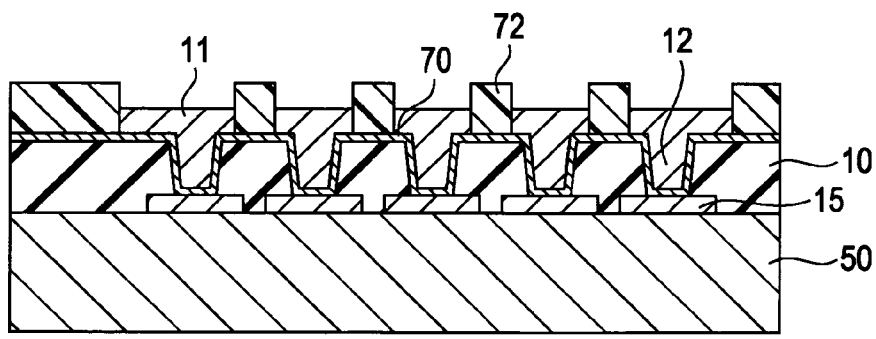
Figure 6D:
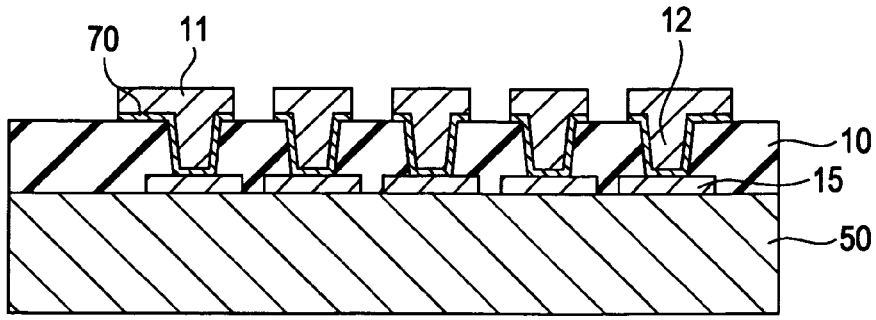

Then, as shown in FIG. 6C, using the resist film 72 as a mask, the via plugs 12 are formed by embedding copper in the via holes 62 by electrolytic plating and also the wiring layer 11 is formed on the interlayer insulating film 10. The via plugs 12 electrically connect the wiring layers 11 thus formed in different layers. Subsequently, as shown in FIG. 6D, after removing the resist film 72, the seed layer 70 in the area beneath the resist film 72 is removed and also the uppermost surface of the wiring layer 11 is removed by etching, and thereby the surface of the wiring layer 11 is cleaned.

Figure 7A:
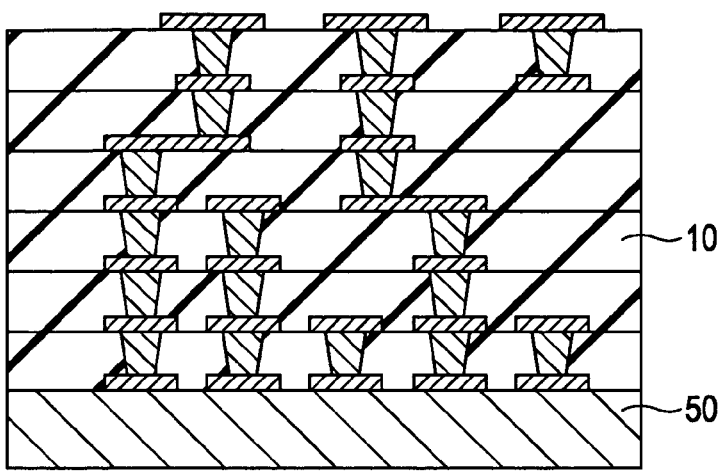
FIGS. 7A to 7C are diagrammatic views (4) for illustrating the example of the method of manufacturing the semiconductor device according to the embodiment.

By repeating the processes described above shown in FIGS. 4A to 6D, a coreless substrate having a multilayer wiring structure as shown in FIG. 7A can be constructed.

Figure 7B:
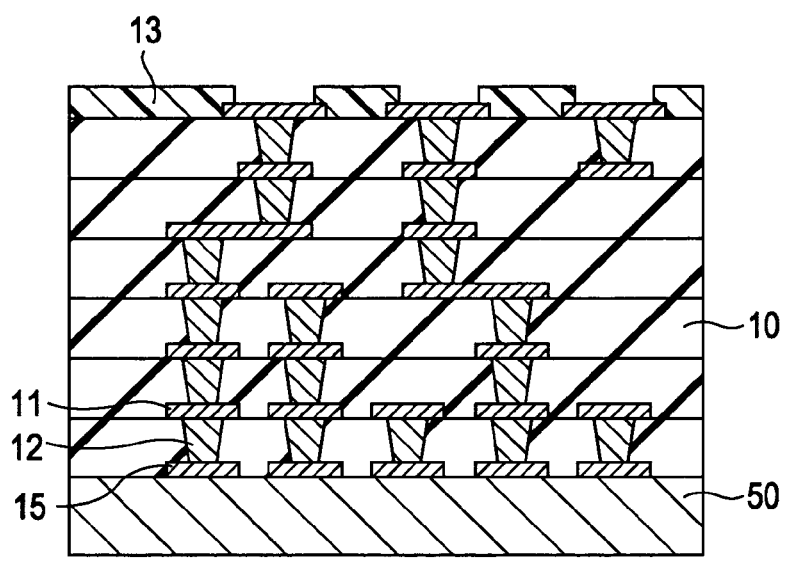
Figure 7C:
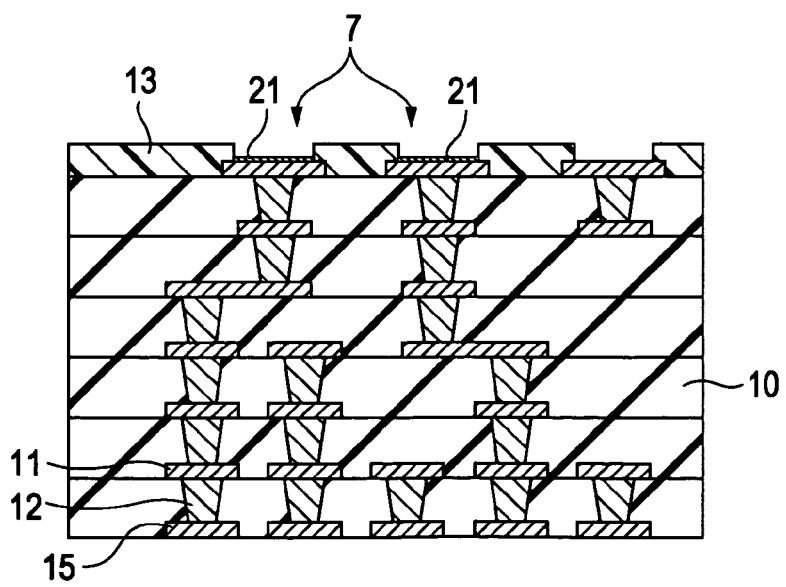

Subsequently, as shown in FIG. 7B, the solder resist layer 13 is formed on the interlayer insulating film 10 so as to expose the uppermost surface of the wiring layer 11 using a resist film (not shown) as a mask. Then, as shown in FIG. 7C, the copper substrate 50 is removed, and also the surface of ball land areas 7, to which BGA balls are coupled, is covered with an organic surface protective coating material (OSP) 21.

Figure 8A:
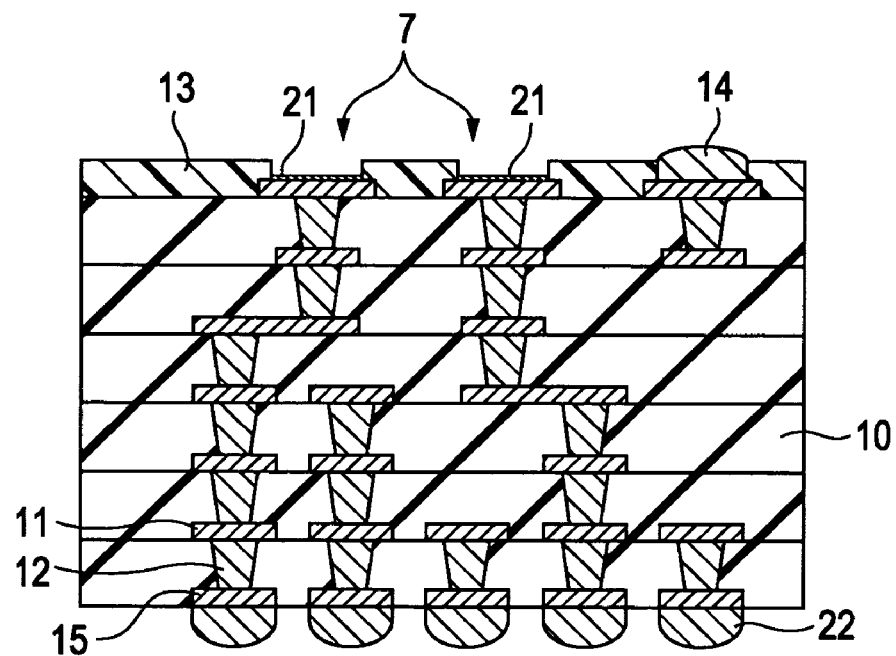
FIGS. 8A and 8B are diagrammatic views (5) for illustrating the example of the method of manufacturing the semiconductor device according to the embodiment.
Figure 8B:
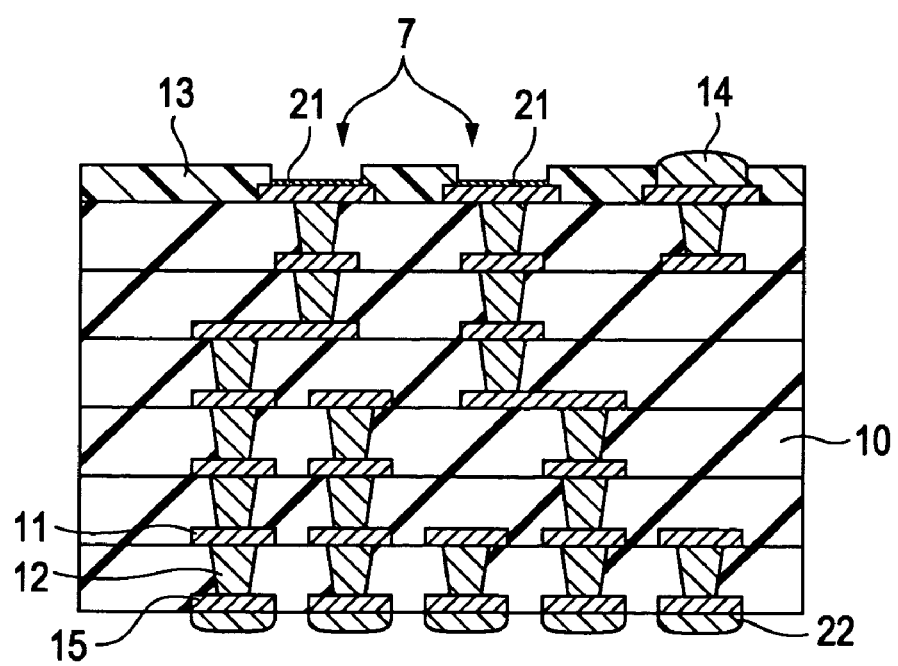

Then, as shown in FIG. 8A, the C4 bumps 22 for flip-chip bonding are soldered on the electrode pads 15. In addition, the electrode pads 14 made of tin (Sn), silver (Ag), copper (Cu), or an alloy thereof are formed on the electrode areas to mount the capacitors 9 by soldering. Subsequently, as shown in FIG. 8B, the C4 bumps 22 are planarized by pressing. The C4 bumps 22 shown in FIG. 8B may be planarized by mechanically polishing.

In the steps described above, the coreless substrate 2 is formed which is used in the present embodiment. The coreless substrate shown in FIG. 8B is drawn vertically opposite to the coreless substrate 2 shown in FIG. 2.

[Method of Mounting Semiconductor Chip]

Figure 9A:
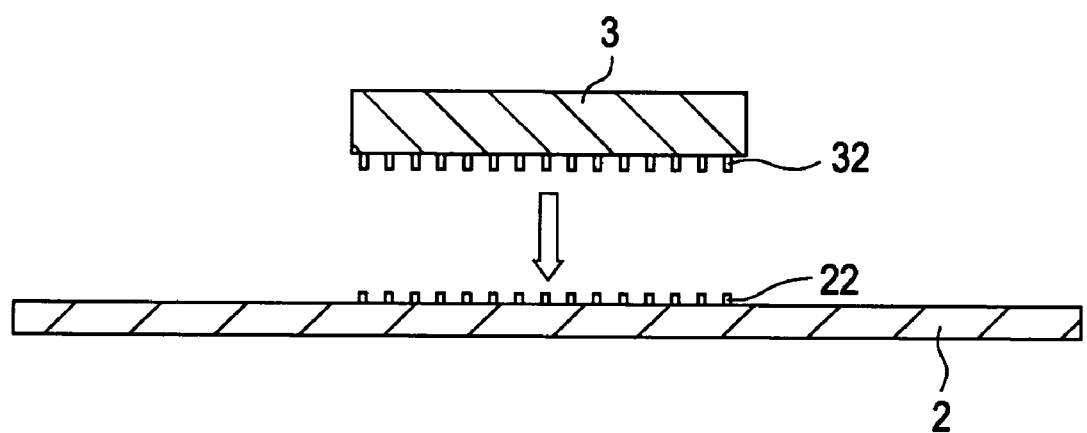
FIGS. 9A and 9B are diagrammatic views (6) for illustrating the example of the method of manufacturing the semiconductor device according to the embodiment.
Figure 9B:
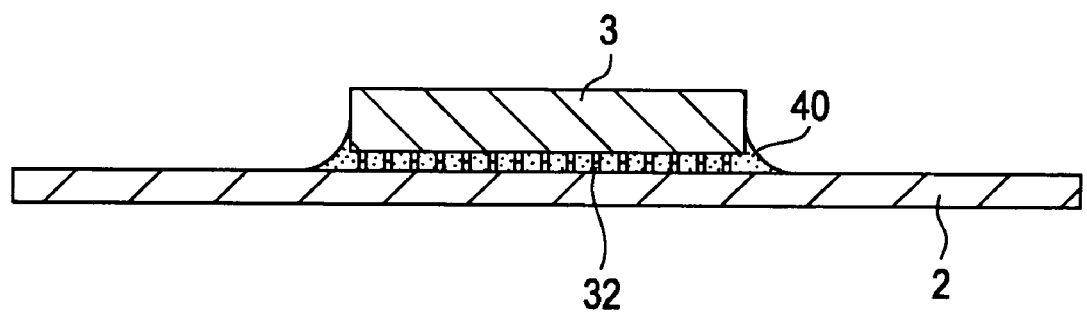

Firstly, as shown in FIG. 9A, while the surface of the semiconductor chip 3 provided with external electrode terminals faces down, solder bumps 32 and corresponding C4 bumps 22 are soldered, and thereby the semiconductor chip 3 is flip-chip bonded. Next, as shown in FIG. 9B, the gap between the semiconductor chip 3 and the coreless substrate 2 is filled with an underfill material 40.

With the steps described above, the semiconductor chip 3 is flip-chip bonded to the coreless substrate 2 while the stress generated in the area coupled with the solders is distributed by the underfill material 40.

[Method of Forming Sealing Resin]

Firstly, an upper mold 200 used for the method of forming a sealing resin includes a runner 202 to be a flow path for a molten sealing resin. The runner 202 includes an opening to a cavity 220 formed when fitting the upper mold 200 and a lower mold 210.

In this procedure, the molding surface of the upper mold 200 includes a chip contact surface 207, which makes contact with the back side of the semiconductor chip 3 during resin molding, and a resin molding surface 206, which is positioned on the periphery of the chip contact surface 207 for molding the sealing resin layer 4. The chip contact surface 207 makes contact with the back side of the semiconductor chip 3 during resin molding, thereby preventing the sealing resin from flowing into the back side of the semiconductor chip 3 during resin molding. The upper mold 200 is further provided with vacuum holes 204 in communication with a vacuum mechanism, such as a pump.

On the other hand, the lower mold 210 includes a pot 214 which is formed so as to allow reciprocation of a plunger 212.

Figure 10A:
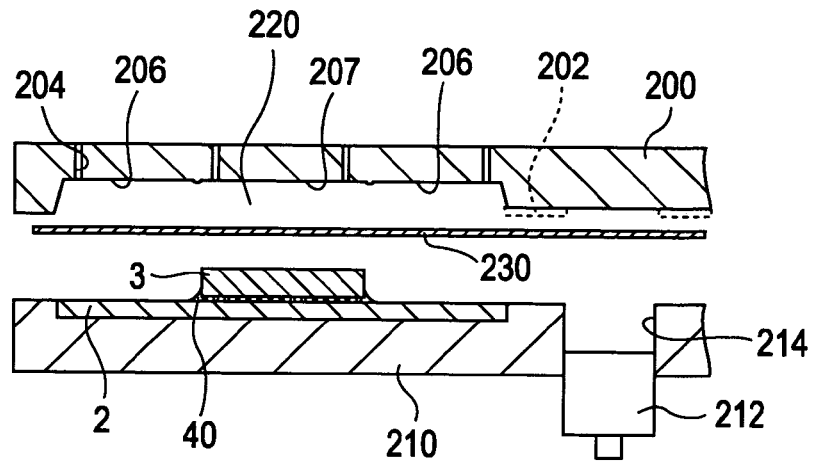
FIGS. 10A to 10C are diagrammatic views (7) for illustrating the example of the method of manufacturing the semiconductor device according to the embodiment.

Using the upper mold 200 and lower mold 210, the coreless substrate 2 having the semiconductor chip 3 is mounted on the lower mold 210 as shown in FIG. 10A. A release film 230 is placed between the upper mold 200 and the lower mold 210.

Figure 10B:
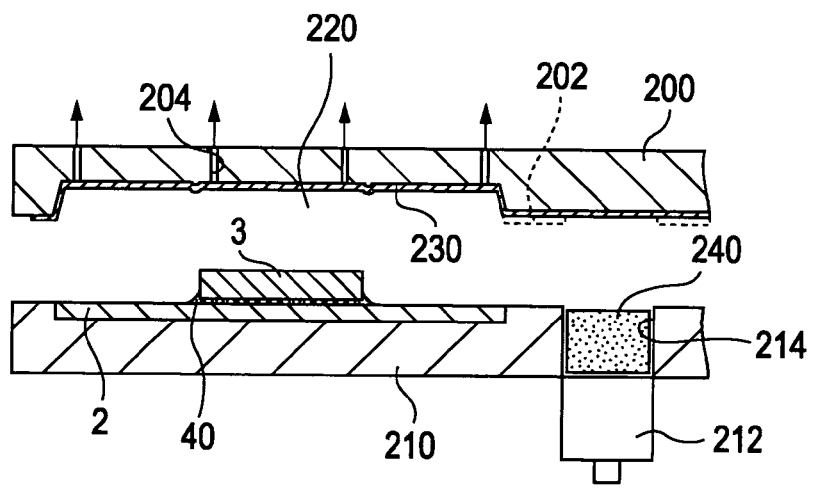
Figure 10C:
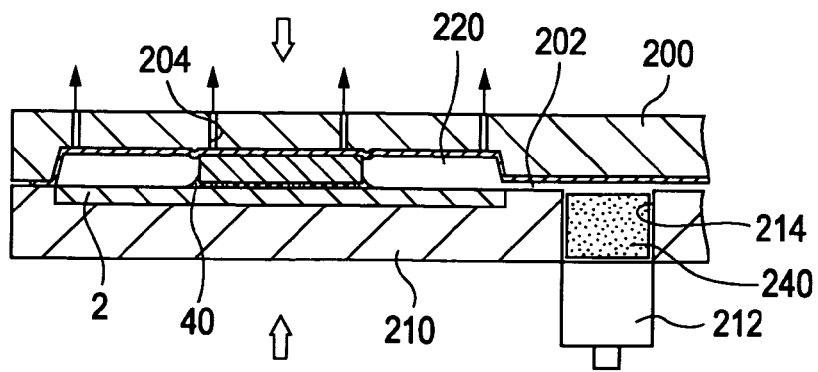

Next, as shown in FIG. 10B, resin tablets 240 produced by solidifying the sealing resin are put into the pot 214. In addition, by activating the vacuum mechanism, the air between the release film 230 and the upper mold 200 is evacuated to closely attach the release film 230 to the upper mold 200. Subsequently, as shown in FIG. 10C, the upper mold 200 and the lower mold 210 are fitted and are clamped while being pressed.

Figure 11A:
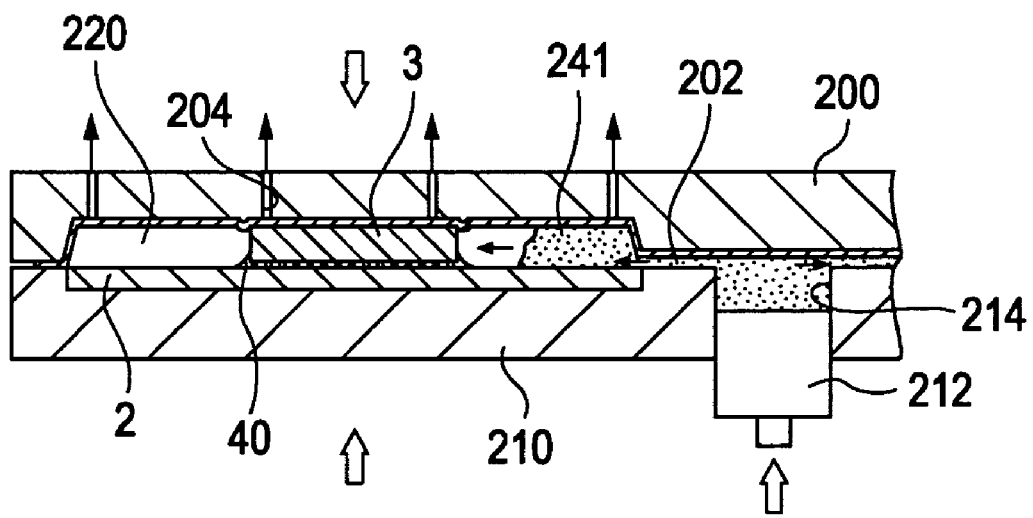
FIGS. 11A and 11B are diagrammatic views (8) for illustrating the example of the method of manufacturing the semiconductor device according to the embodiment.

Then, as shown in FIG. 11A, while the resin tablets 240 were melted by heating, the plunger 212 is plunged into the pot 214, and thereby a liquid sealing resin 241 is introduced into the cavity 220. After filling the space formed between the upper mold 200 and the coreless substrate 2 with the sealing resin 241, the sealing resin 241 is heated for a certain period of time to solidify. Although the present embodiment uses a thermosetting sealing resin as an example for description, a sealing resin that is solidified by cooling may also be used.

Figure 11B:
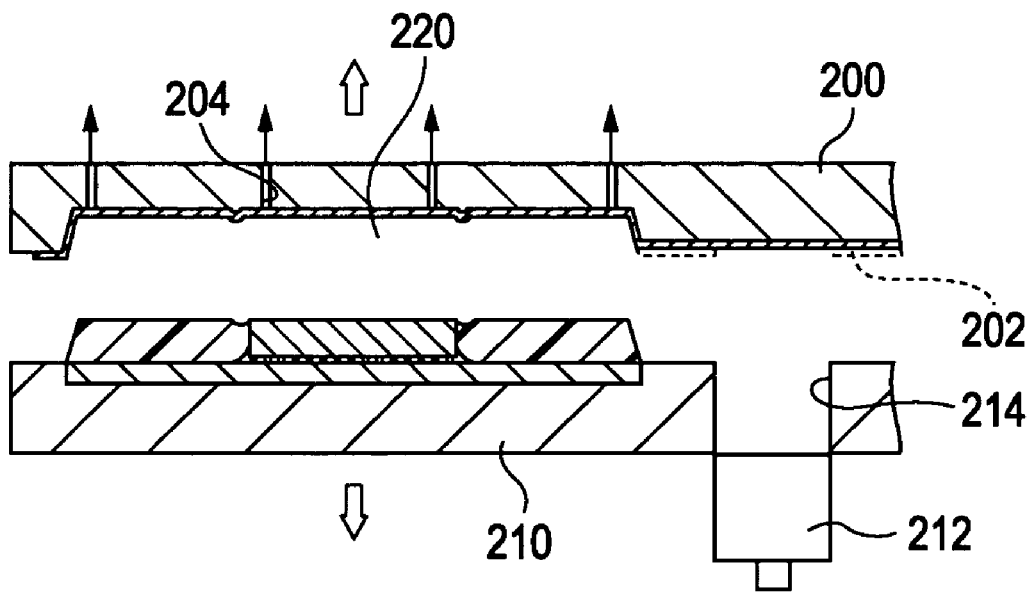

Then, as shown in FIG. 11B, the upper mold 200 and the lower mold 210 are separated from each other to take out the coreless substrate 2 on which the sealing resin layer 4 is formed.

According to the method of forming a sealing resin described above, it is possible to form the sealing resin layer 4 that seals the semiconductor chip 3 within the periphery of the semiconductor chip 3.

Moreover, it is possible to mold the sealing resin layer 4 without making the sealing resin 241 contact with, for example, an inner surface of the cavity 220. Furthermore, because the coreless substrate 2 having the sealing resin layer 4 molded thereon can be easily separated using the release film 230, it is not necessary to provide an ejector pin or the like in the upper mold 200. This simplifies the mold structure, so that it is possible to reduce the costs for manufacturing a semiconductor device. Moreover, a sealing resin material optimum for a semiconductor device can be used, so that the freedom of semiconductor device design is increased.

[Method of Attaching Lid]

Firstly, the TIM material 17 is applied on the back side of the semiconductor chip 3, and the adhesive material (sealing band material) 18 is applied on the surface of the sealing resin layer 4. Subsequently, the lid 5 provided with the dimples 16a on the side coupled to the sealing resin layer 4 is coupled to the back side of the semiconductor chip 3 and to the surface of the sealing resin layer 4, and thereby the semiconductor device 1 as shown in FIGS. 1A and 1B can be obtained.

In the semiconductor device 1 according to the present embodiment, the lid 5 is provided with the plurality of dimples 16a on the side coupled to the sealing resin layer 4, and an excess of the sealing band material 18 can be accommodated in the dimples 16a. Thus, the sealing band material 18 does not leak out of the lid 5 and the coreless substrate 2, and the defects caused by the leakage of the sealing band material 18 can be eliminated. In addition, by providing the dimples 16a, the contact area of the lid 5 and the sealing band material 18 is increased, which leads to a strong bond between the coreless substrate 2 and the lid 5.

Figure 12A:
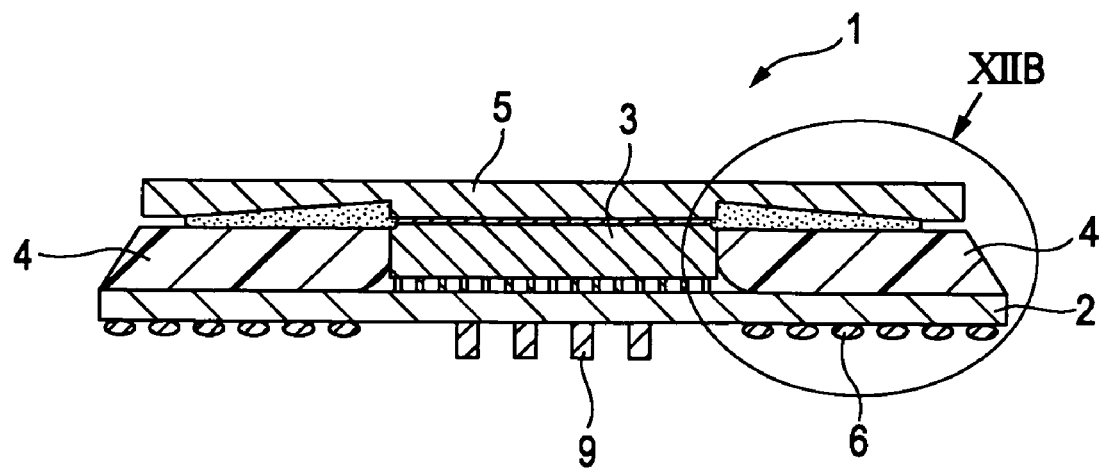
FIGS. 12A and 12B are diagrammatic views for illustrating a modified example (1) of a semiconductor device according to an embodiment.
Figure 12B:
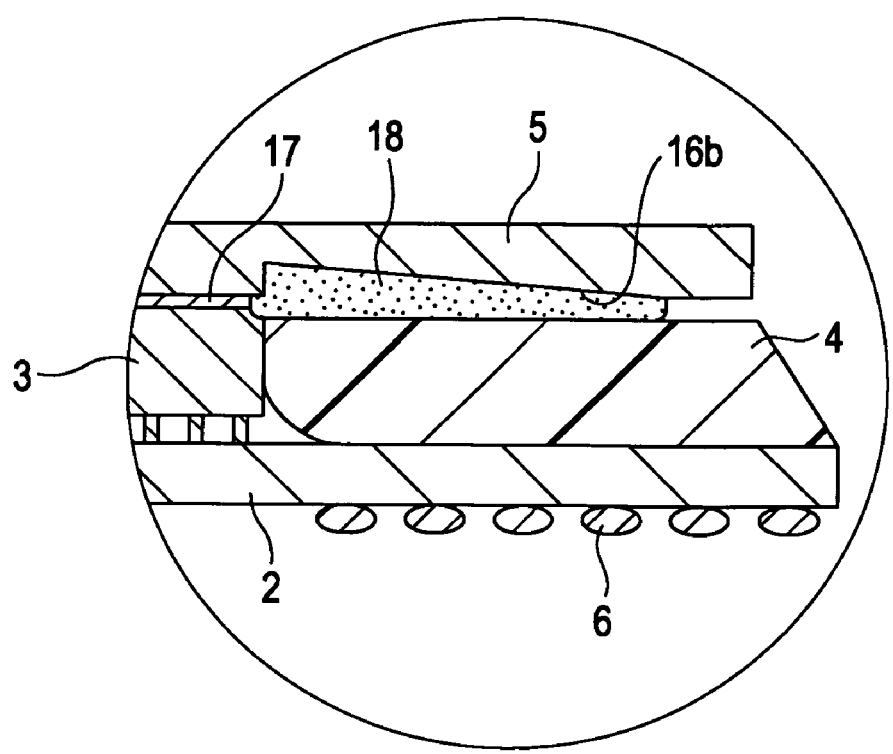

FIGS. 12A and 12B are diagrammatic views for illustrating a modified example (1) of a semiconductor device according to an embodiment of the present invention, and the semiconductor device 1 shown in the drawing has the lid 5 provided with a recess 16b on the side coupled to the sealing resin layer 4. In the drawing, the recess 16b is formed so as to increase the depth from the peripheral region towards the center region of the lid 5. The configuration other than that is same as the example of a semiconductor device according to the embodiment of the present invention.

In the modified example (1) of the semiconductor device according to an embodiment, the lid 5 is provided with the recess 16b, which is formed so as to increase the depth from the peripheral region towards the center region, on the side coupled to the sealing resin layer 4 and an excess of the sealing band material 18 leaks out towards the center region. In other words, the excess of the sealing band material 18 between the sealing resin layer 4 and the lid 5 leaks out towards the center region with a large clearance width where the pressure is not focused. The sealing band material 18 does not, thus, leak out of the lid 5 and the coreless substrate 2, and the defects caused by the leakage of the sealing band material 18 can be eliminated.

Figure 13A:
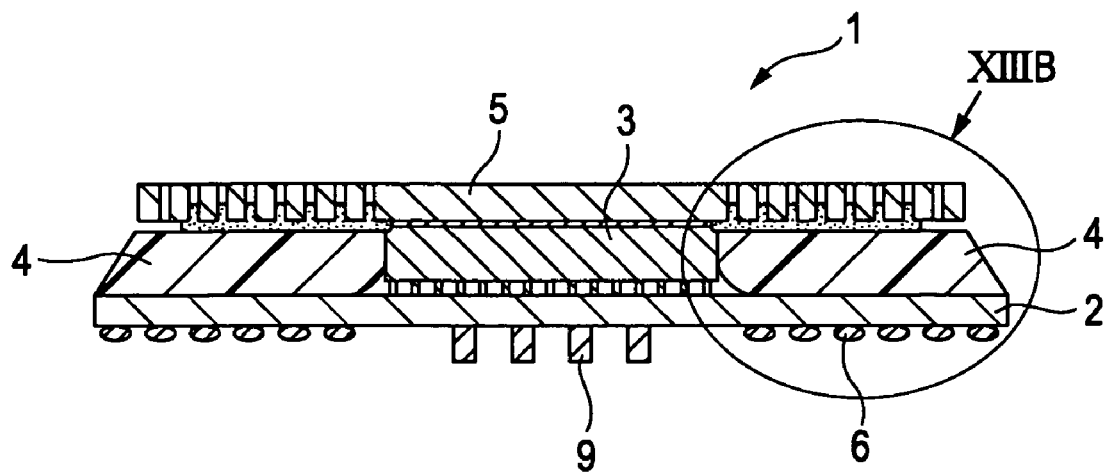
FIGS. 13A and 13B are diagrammatic views for illustrating another modified example (2) of a semiconductor device according to an embodiment.
Figure 13B:
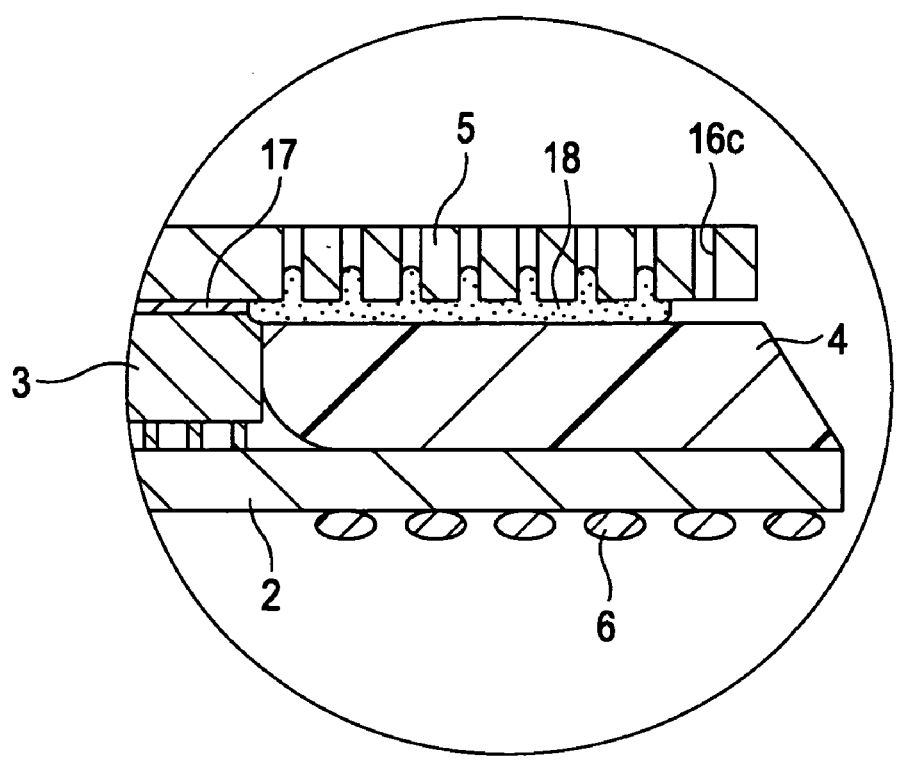

FIGS. 13A and 13B are diagrammatic views for illustrating another modified example (2) of a semiconductor device according to an embodiment of the present invention, and the semiconductor device 1 shown in the drawing has the lid 5 with a plurality of through holes 16c formed on the side coupled to the sealing resin layer 4. The through holes 16c in the drawing are an example of the uneven area. The configuration other than that is same as the example of a semiconductor device according to the embodiment of the present invention.

In the modified example (2) of the semiconductor device according to an embodiment of the present invention, the lid 5 is provided with the plurality of through holes 16c on the side coupled to the sealing resin layer 4, and an excess of the sealing band material 18 can be accommodated in the through holes 16c. The sealing band material 18 does not, thus, leak out of the lid 5 and the coreless substrate 2, and the defects caused by the leakage of the sealing band material 18 can be eliminated. In addition, by providing the through holes 16c, the contact area of the lid 5 and the sealing band material 18 is increased, which leads to a strong bond between the coreless substrate 2 and the lid 5.

The through holes 16c further can function as air vents and reduce air drift, so that it becomes possible to sufficiently handle the popcorn phenomena during moisture absorption reflow processing and the like. However, various indications (printings) are typically made on the surface of the lid 5, and the through holes 16c may interfere with providing such indications (printings). In such a case, it is preferred to provide the dimples 16a, not the through holes 16c, as the above-described semiconductor device according to the embodiment of the present invention.

Figure 14A:
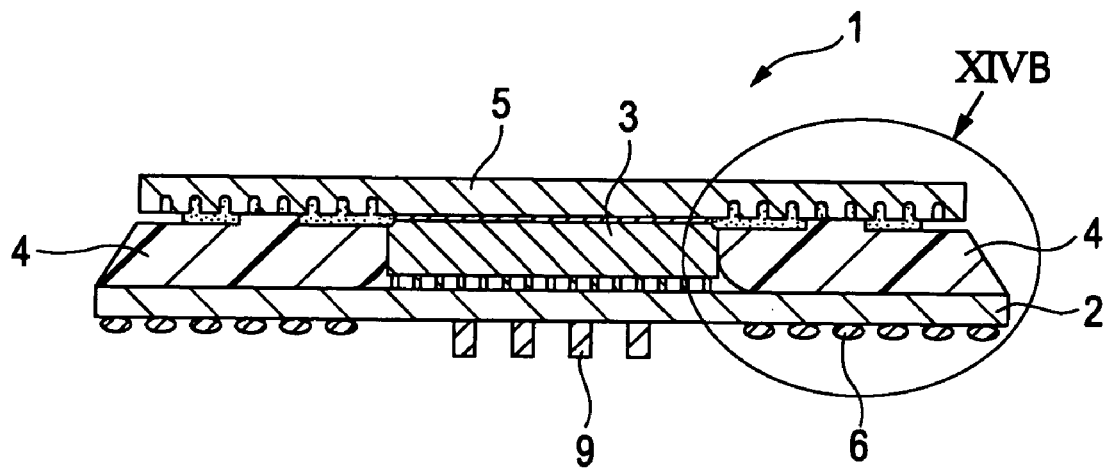
FIGS. 14A and 14B are diagrammatic views for illustrating another modified example (3) of a semiconductor device according to an embodiment.
Figure 14B:
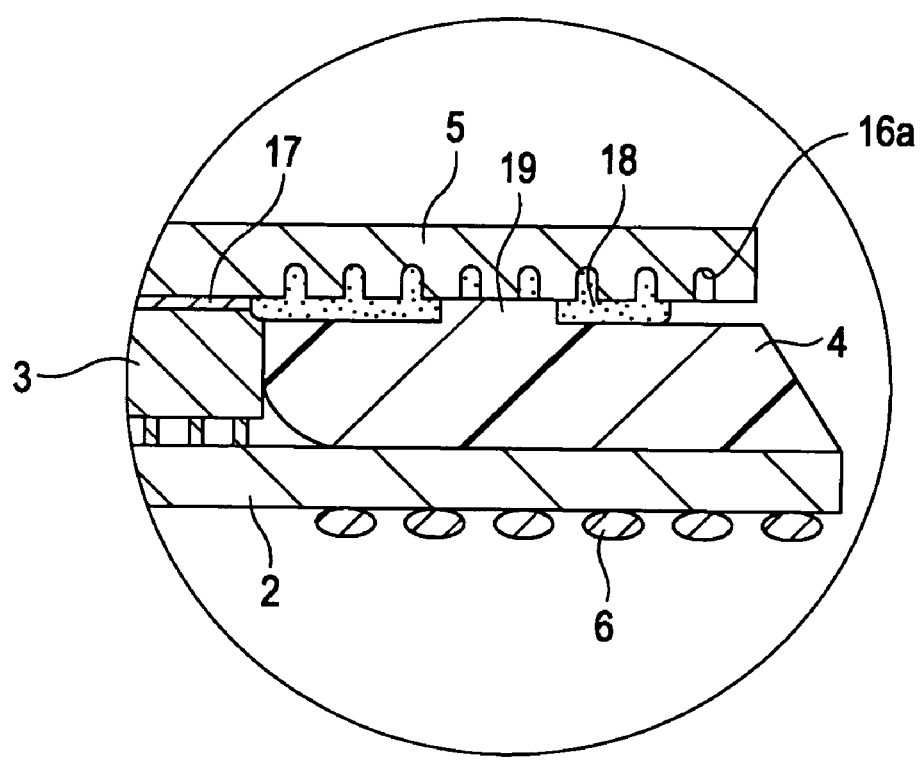
Figure 15:
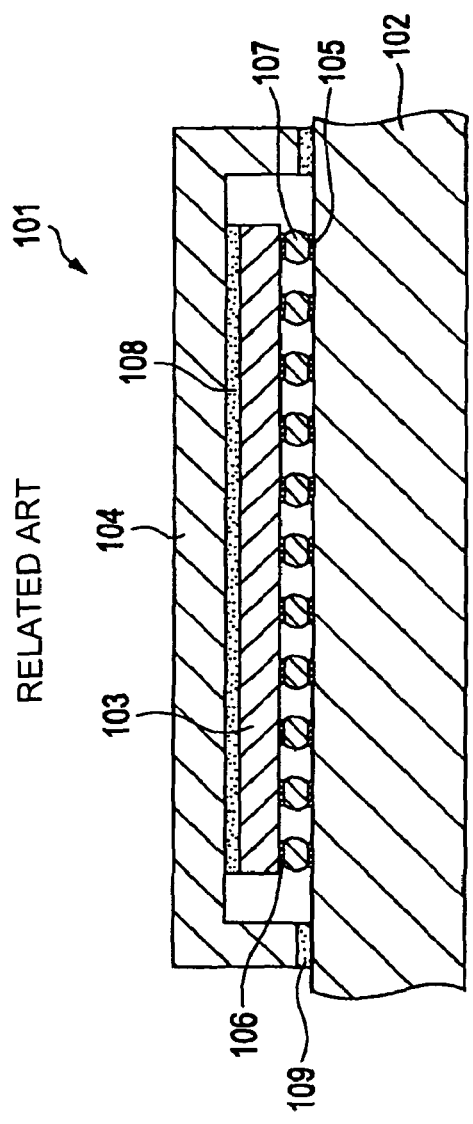
FIG. 15 is a diagrammatic view (1) for illustrating a semiconductor device in related art.
Figure 16:
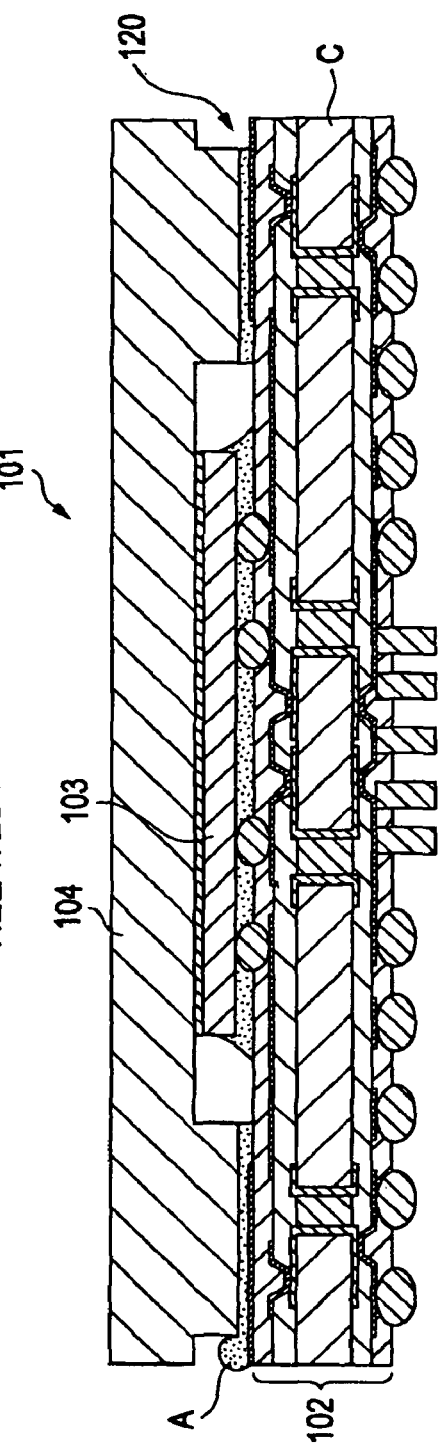
FIG. 16 is a diagrammatic view (2) for illustrating another semiconductor device in related art.

FIGS. 14A and 14B are diagrammatic views for illustrating another modified example (3) of a semiconductor device according to an embodiment of the present invention, and the semiconductor device 1 shown in the drawing has the sealing resin layer 4 provided with a projection area 19. The configuration other than that is same as the example of a semiconductor device according to the embodiment of the present invention.

In the modified example (3) of the semiconductor device according to an embodiment of the present invention, by providing the projection area 19, the contact area of the sealing resin layer 4 and the sealing band material 18 is increased, which leads to a strong bond between the coreless substrate 2 and the lid 5. Since the sealing resin layer 4 is molded by filling a space between the upper mold 200 and the lower mold 210 with the sealing resin 241, the projection area 19 can also be easily molded.

Although these embodiments are described using a reinforcement material formed of a resin material as an example, such a reinforcement material is not particularly limited to those formed of a resin material and may also be formed by, for example, stacking a reinforcement material made of a metal material.

The present application contains subject matter related to that disclosed in Japanese Priority Patent Application JP 2008-272247 filed in the Japan Patent Office on Oct. 22, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
    a thermal interface material in physical contact with a central region of a lid, a recess extending into a peripheral region of the lid;
    a semiconductor chip between said thermal interface material and a central region of a substrate, a sealing resin layer being between a sealing band material and a peripheral region of the substrate, wherein said sealing band material is within said recess, said thermal interface material being adjacent to said recess and said sealing band material.

2. The semiconductor device according to claim 1, wherein said sealing resin layer is in physical contact with said peripheral region of the substrate and said sealing band material.

3. The semiconductor device according to claim 1, wherein said semiconductor chip is between a capacitor and said central region of the substrate.

4. The semiconductor device according to claim 1, wherein a surface of the lid is in physical contact with said thermal interface material and said sealing band material, said recess extending into said peripheral region of the lid from said surface.

5. The semiconductor device according to claim 1, wherein said recess is a dimple that partially extends into said lid.

6. The semiconductor device according to claim 1, wherein said recess is a hole that extends through said lid.

7. The semiconductor device according to claim 1, wherein a depth of said recess into said increases from an edge of the lid.

8. The semiconductor device according to claim 1, wherein said sealing band material is between said sealing resin layer and said peripheral region of the lid.

9. The semiconductor device according to claim 1, wherein said sealing resin layer is in physical contact with said semiconductor chip.

10. The semiconductor device according to claim 1, wherein said sealing band material is an adhesive material.

11. The semiconductor device according to claim 1, wherein said sealing band material is in physical contact with said lid.

12. The semiconductor device according to claim 1, wherein said lid is a highly thermally conductive material.

13. The semiconductor device according to claim 1, wherein said substrate comprises stacked interlayer insulating films and wiring, said wiring being throughout said stacked interlayer insulating films.

14. The semiconductor device according to claim 1, wherein said peripheral region of the substrate is between said sealing resin layer and a solder ball.

15. The semiconductor device according to claim 1, wherein an underfill material is between said semiconductor chip and said central region of the substrate.

16. The semiconductor device according to claim 1, wherein solder bumps extend from said semiconductor chip and connection bumps extend from said central region of the substrate, said solder bumps being in physical and electrical contact with said connection bumps.

17. The semiconductor device according to claim 1, wherein said semiconductor chip is in physical contact with said central region of the substrate and said thermal interface material.

18. The semiconductor device according to claim 1, wherein said thermal interface material is configured to transfer heat between said semiconductor chip and said lid.

19. The semiconductor device according to claim 1, wherein said thermal interface material is in physical contact with said semiconductor chip and said central region of the lid.

20. The semiconductor device according to claim 1, wherein said thermal interface material is a mixture of a thermally conductive filler and a resin material.

21. The semiconductor device according to claim 20, wherein said mixture includes a curable silicone composition.

22. The semiconductor device according to claim 20, wherein said thermally conductive filler is from the group consisting of silver, aluminum, aluminum oxide, and silicon dioxide.

23. A method of manufacturing the semiconductor device of claim 1, the method comprising:
    clamping an upper mold to a lower mold to form a cavity, said semiconductor chip and said substrate being encased between said upper and lower molds;
    introducing a liquid sealing resin into said cavity, said liquid sealing resin solidifying to become said sealing resin layer.

* * * * *